US012756311B2

(12) United States Patent
Yi et al.

(10) Patent No.: US 12,756,311 B2
(45) Date of Patent: Oct. 6, 2026

(54) POWER MANAGEMENT INTEGRATED CIRCUIT

(71) Applicant: SG MICRO CORP, Beijing (CN)

(72) Inventors: Xinmin Yi, Beijing (CN); Lingli Ma, Beijing (CN)

(73) Assignee: SG MICRO CORP, Beijing (CN)

( * ) Notice: Subject to any disclaimer, the term of this patent is extended or adjusted under 35 U.S.C. 154(b) by 0 days.

(21) Appl. No.: 18/847,673

(22) PCT Filed: Apr. 19, 2023

(86) PCT No.: PCT/CN2023/089245
§ 371 (c)(1),
(2) Date: Sep. 16, 2024

(87) PCT Pub. No.: WO2024/021695
PCT Pub. Date: Feb. 1, 2024

(65) Prior Publication Data

US 2025/0211113 A1 Jun. 26, 2025

(30) Foreign Application Priority Data

Jul. 25, 2022 (CN) ......................... 202210876941.6

(51) Int. Cl.
*H02M 3/158* (2006.01)
*H02M 1/08* (2006.01)
(Continued)

(52) U.S. Cl.
CPC ............. *H02M 3/158* (2013.01); *H02M 1/08* (2013.01); *H02M 3/157* (2013.01); *H03K 3/3565* (2013.01)

(58) Field of Classification Search
CPC ........ H02M 3/157; H02M 3/158; H02M 1/08; H03K 3/3565; H03K 17/04123; H03K 2217/0063; H03K 2217/0081
See application file for complete search history.

(56) References Cited

U.S. PATENT DOCUMENTS 6,624,678 B1 9/2003 Boutard et al.
10,707,840 B2 * 7/2020 Bodano ............ H03K 17/04106
(Continued)

FOREIGN PATENT DOCUMENTS

CN 1711684 A 12/2005
CN 102118516 A 7/2011
(Continued)

OTHER PUBLICATIONS

Translation of Chinese Office Action for corresponding Chinese Application No. CN 202210876941.6, dated Jan. 9, 2026, 14 pages.

*Primary Examiner* — Menatoallah Youssef
*Assistant Examiner* — Colleen J O Toole
(74) *Attorney, Agent, or Firm* — Westman, Champlin & Koehler, P.A.

(57) ABSTRACT

The present application discloses a power management integrated circuit includes an I2C interface circuit and a driving circuit. The I2C interface circuit receives regulation parameters from the host controller. The driving circuit converts a switching signal into a driving signal and applies the driving signal to a control terminal of a power switch in the power management integrated circuit, and that regulates power transmission from the input terminal to an output terminal of the power management integrated circuit by controlling on and off states of the power switch to provide a stable output voltage, the switching signal being obtained according to the regulation parameters. The power management integrated circuit has improved communication accuracy by adjusting a driving speed of the driving circuit and/or a supply voltage of the I2C interface circuit when communication of the I2C interface is interfered.

12 Claims, 4 Drawing Sheets

(51) Int. Cl.

| | |
|---|---|
| ***H02M 3/157*** | (2006.01) |
| ***H03K 3/3565*** | (2006.01) |

(56) References Cited

U.S. PATENT DOCUMENTS

| | | | | |
|---|---|---|---|---|
| 11,456,668 | B2 * | 9/2022 | Lalithambika | H02M 1/0006 |
| 11,784,636 | B2 * | 10/2023 | Akahane | H03K 17/302 327/206 |
| 2015/0066230 | A1 | 3/2015 | Ulrich | |
| 2021/0126537 | A1 | 4/2021 | Lalithambika et al. | |
| 2022/0216721 | A1 | 7/2022 | Chen et al. | |

FOREIGN PATENT DOCUMENTS

| | | | |
|---|---|---|---|
| CN | 205610477 | U | 9/2016 |
| CN | 208190615 | U | 12/2018 |
| CN | 111769736 | A | 10/2020 |
| CN | 113114173 | A | 7/2021 |
| CN | 113381739 | A | 9/2021 |

* cited by examiner

POWER MANAGEMENT INTEGRATED CIRCUIT

CROSS REFERENCE TO RELATED APPLICATION(S)

This application is a Section 371 National Stage application of International Application No. PCT/CN2023/089245, filed on 19 Apr. 2023, which published as WO 2024/021695 A1 which published on 1 Feb. 2024, and claims priority to the Chinese invention application Ser. No. 20/221, 08769416, filed on Jul. 25, 2022, and entitled "POWER MANAGEMENT INTEGRATED CIRCUIT", the contents of which are hereby incorporated by reference in their entireties.

TECHNICAL FIELD

The present disclosure relates to the technical field of power management, and more particularly, to a power management integrated circuit.

BACKGROUND

With the rapid development of 5G and the Internet of Things, various types of electronic devices are continued to be upgraded with increasing demand. Such electronic devices generally do not use the power grid or batteries to directly supply power, but instead convert an external high voltage into a precise and stable supply voltage by a regulated power supply such as a switching power converter. Therefore, power supply management integrated circuits are very important for these electronic devices.

In the power management integrated circuits using I2C communication, information exchange between an external host and internal registers is typically achieved through serial data (SDA) and serial clock (SCL) pins, enabling users to flexibly configure charging and discharging parameters and read the status of the power supply.

FIG. 1 shows a schematic circuit diagram of a conventional I2C interface circuit 100 of a power management integrated circuit. As shown in FIG. 1, the I2C interface circuit 100 includes a trigger unit 110 powered by an I/O voltage and an output buffer 120 powered by an internal voltage.

The trigger unit 110 includes an input terminal 111 for receiving a logic input signal SCL_in and coupling the logic input signal SCL_in to gates of transistors M1-M4. The transistors M1-M4 are sequentially connected between a supply voltage VDIO, which is an internal I/O voltage designed for an interface circuit, and a ground voltage Vss, which is a ground having noise in the integrated circuit. An inverter 112 has an input terminal which is coupled with drains of the transistors M2 and M3 at node p1, and an output terminal which is coupled with gate of transistor M7 in the output buffer 120. An inverter 113 has an input terminal which is coupled to the output terminal of the inverter 112, and an output terminal which is coupled to gate of transistor M8 in the output buffer 120. A transistor M5 has a source which is coupled with a drain of transistor M1 and a source of transistor M2, and a drain which is coupled to the ground voltage Vss. A transistor M6 has a source which is coupled with a source of transistor M3 and a drain of transistor M4, and a drain which is coupled to the supply voltage VDIO. Gates of the transistors M5 and M6 are coupled with an output terminal of the inverter 113 at node p2.

The output buffer 120 also includes transistors M9 and M10. Sources of the transistors M9 and M10 are coupled to the supply voltage VDD. Transistor M9 has a gate which is coupled with a drain of transistor M10. Transistor M10 has a gate which is coupled with a drain of transistor M9. Drains of the transistors M9 and M10 are also coupled with drains of transistors M7 and M8, respectively. Sources of the transistors M7 and M8 are coupled to the ground voltage Vss. Drain of the transistors M8 is also coupled to a logic output signal SCL_out.

In addition, a resistor R1 and a transistor M0 in FIG. 1 are peripheral circuits of the integrated circuit. The resistor R1 and transistor M0 are sequentially coupled between a voltage VREF_out and a ground voltage Vss_out, wherein the voltage VREF_out and the ground voltage Vss_out are respectively the power supply and the ground of the peripheral circuit.

In a case that there is no a voltage difference between the ground and the power supply of circuits inside and outside the integrated circuit, a control signal Host Control of the host controller is used to turn on or off transistor M0 by controlling a gate voltage of transistor M0. When transistor M0 is turned on, the logic input signal SCL_in is equal to Vss_out+Vds (M0), which is about equal to the ground voltage Vss_out. When transistor M0 is turned off, the logic input signal SCL_in is equal to the voltage VREF_out−VR1, which is about equal to the voltage VREF_out.

When the logic input signal SCL_in is at a low level, the transistors M1, M2, M6 are turned on, the transistors M3-M5 are turned off. Voltages at the nodes p1 and p2 are about equal to the supply voltage VDIO, and then transistor M8 is turned on, pulling the output signal SCL_out down to the ground voltage Vss. When the logic input signal SCL_in reverses from a low level to a high level, if the voltage of the logic input signal SCL_in is larger than an on threshold of transistor M4, transistor M4 is first turned on, and then the transistors M3 is turned on. Subsequently, the transistors M1 and M2 are turned off to pull the nodes p1 and p2 down to Vss. Transistor M8 is then turned off, and the logic output signal SCL_out is pulled up to the power supply VDD. Consequently, the logic output signal SCL_out reverses from a low level to a high level. Similarly, the integrated circuit is also able to achieve reverse of the output signal SCL_out from the high level to the low level. Thus, the integrated circuit performs a level shift between a logic signal of the power supply (i.e. Host Control) and a logic signal of the internal power rail.

However, in practical applications, there will be a certain voltage difference between the ground and the power supply of the internal and external circuits of the integrated circuit due to noise or connections. When there is a voltage difference between the power supply rails of the internal and external circuits of the integrated circuit, it may cause damage of the internal circuit and false triggering or missing triggering of signal during I2C communication.

Taking the case where an internal ground voltage is lower than an external ground voltage, as an example, operating waveforms of a conventional I2C interface circuit 100 are shown in FIG. 2. The logic input signal SCL_in and the logic output signal SCL_out have level variations as shown in FIG. 2, respectively. A slashed area in FIG. 2 represents an effective input voltage range under an ideal circumstance, and a shaded area represents an effective input voltage range under actual circumstances. In an ideal circumstance, if the logic input signal SCL_in has a low level falling into Vss~VDD_lmax and a high level falling into Vin_hmin~VDIO (as shown by the slashed area in FIG. 2), the internal I2C interface circuit can normally identify the logic input signal SCL_in and reverses at an output (as shown by a dotted line of the SCL_out signal). When the ground voltage of the internal I2C interface circuit decreases due to switching noise of a power transistor of the switching power converter, the effective voltage range decreases. As shown in the shaded area in FIG. 2, the logic input signal SCL_in may have high and low levels falling outside a voltage range defined by the shaded area, resulting in a missing reverse when the internal I2C interface circuit cannot normally identify a level variation of the logic input signal SCL_in, as shown in a solid line of SCL_out in FIG. 2, thus causing interference to I2C communication.

SUMMARY

In view of this, it is an object of the present disclosure to provide a power management integrated circuit that can adjust a supply voltage of an I2C interface circuit and balance efficiency of a DC/DC converter and communication stability of the I2C interface.

According to an embodiment of the present disclosure, there is provided a power management integrated circuit comprising: an I2C interface circuit that is coupled with a logic pin of the integrated circuit and communicates with an external host controller to receive regulation parameters set by the host controller; and a driving circuit that converts a switching signal into a driving signal and applies the driving signal to a control terminal of a power switch in the power management integrated circuit, and that regulates power transmission from the input terminal to an output terminal of the power management integrated circuit by controlling on and off states of the power switch to provide a stable output voltage, the switching signal being obtained according to the regulation parameters, wherein a driving speed of the driving circuit and/or a supply voltage of the I2C interface circuit is adjustable.

Optionally, the driving circuit comprises: a buffer having an input terminal for receiving the switching signal; power management integrated circuit; and a driving control unit that receives a first regulation signal, controls a signal path between the second totem pole circuit and the buffer according to the first regulation signal, and adjusts the driving speed of the driving circuit by enabling or disabling the second totem pole circuit.

Optionally, the I2C interface circuit comprises: a supply voltage generation unit that supplies a supply voltage to a trigger unit, receives a second regulation signal, and adjusts a value of the supply voltage according to the second regulation signal; a trigger unit that receives a logic input signal from a logic pin of the integrated circuit, and compares the logic input signal with a threshold voltage to generate a first signal; and an output buffer for shaping the first signal to obtain a logic output signal.

Optionally, the second totem pole circuit comprises: a first transistor and a second transistor coupled between a first voltage and a second voltage, control terminals of the first transistor and the second transistor being coupled with an output of the driving control unit, and an intermediate node of the first transistor and the second transistor being coupled with a control terminal of the power switch.

Optionally, the driving control unit comprises: a first switch coupled between the output of the buffer and the control terminal of the first transistor; and a second switch coupled between the output of the buffer and the control terminal of the second transistor, wherein the first regulation signal controls a signal path between the buffer and the second totem pole circuit by controlling on and off states of the first switch and the second switch.

Optionally, the driving control unit further comprises: a third transistor having a first terminal coupled to the first voltage, a second terminal coupled with the control terminal of the first transistor, and a control terminal coupled to the first regulation signal; and a fourth transistor having a first terminal coupled with the control terminal of the second transistor, a second terminal coupled to the second voltage, and a control terminal coupled to an inverted signal of the first regulation signal.

Optionally, when the first regulation signal is at a high level, the first switch and the second switch are turned on, the third transistor and the fourth transistor are turned off, and the first transistor and the second transistor are turned on alternatively in non-overlapping manner according to the output of the buffer; when the first regulation signal is at a low level, the first switch and the second switch are turned off, the third transistor and the fourth transistor are turned on, and the first transistor and the second transistor are turned off.

Optionally, the first transistor and the third transistor are P-channel transistors, and the second transistor and the fourth transistor are N-channel transistors.

Optionally, the supply voltage generation unit comprises: a first current source, a fifth resistor, a sixth resistor, and a first resistor which are sequentially coupled between a supply voltage and a ground voltage, each of the fifth resistor and the sixth resistor being connected as a MOS diode; a seventh transistor and a second current source which are sequentially coupled between the supply voltage and the ground voltage, a control terminal of the seventh transistor being coupled with a second end of the first current source, a second terminal of the seventh transistor being used to provide the supply voltage. an inverter having an input terminal for receiving the second regulation signal; and an eighth transistor coupled in parallel with the sixth transistor, and a control terminal of the eighth transistor being coupled with an output terminal of the inverter.

Optionally, the trigger unit is a Schmitt trigger.

Optionally, the ground voltage is a ground having noise in the integrated circuit.

Optionally, the power management integrated circuit further comprises: a power circuit, comprising at least one power switch and an inductor element, and being used to regulate power transmission from an input terminal to an output terminal of the power management integrated circuit to provide a stable output voltage; a logic control circuit for receiving the regulation parameters from the I2C interface circuit and converting the regulation parameters into parameter information available for a switching controller; and a switching controller for generating a switching signal according to the parameter information.

Optionally, regulation signals of a driving speed of the driving circuit and/or a supply voltage of the I2C interface circuit are derived from a trimming signal outside the integrated circuit, or are provided by the logic control circuit.

The power management integrated circuit according to the present disclosure includes an I2C interface circuit, and can provide a first regulation signal and/or a second regulation signal when communication of the I2C interface circuit is interfered. This allows for adjustment of a driving speed of the driving circuit and/or a supply voltage of the I2C interface circuit. Consequently, when the I2C communication of the integrated circuit is interfered, the driving speed of the converter may be decreased, and even the supply voltage of the I2C interface circuit may be increased, to achieve the purpose of improving communication accuracy. Moreover, the power management integrated circuit according to the present disclosure can also optimize and balance corresponding functions according to actual applications, so as to balance an efficiency of the converter while improving the communication accuracy.

BRIEF DESCRIPTION OF THE DRAWINGS

The foregoing and other objects, features and advantages of the present disclosure will become clearer by the following description of embodiments of the present disclosure with reference to the accompanying drawings.

DETAILED DESCRIPTION

Figure 1:
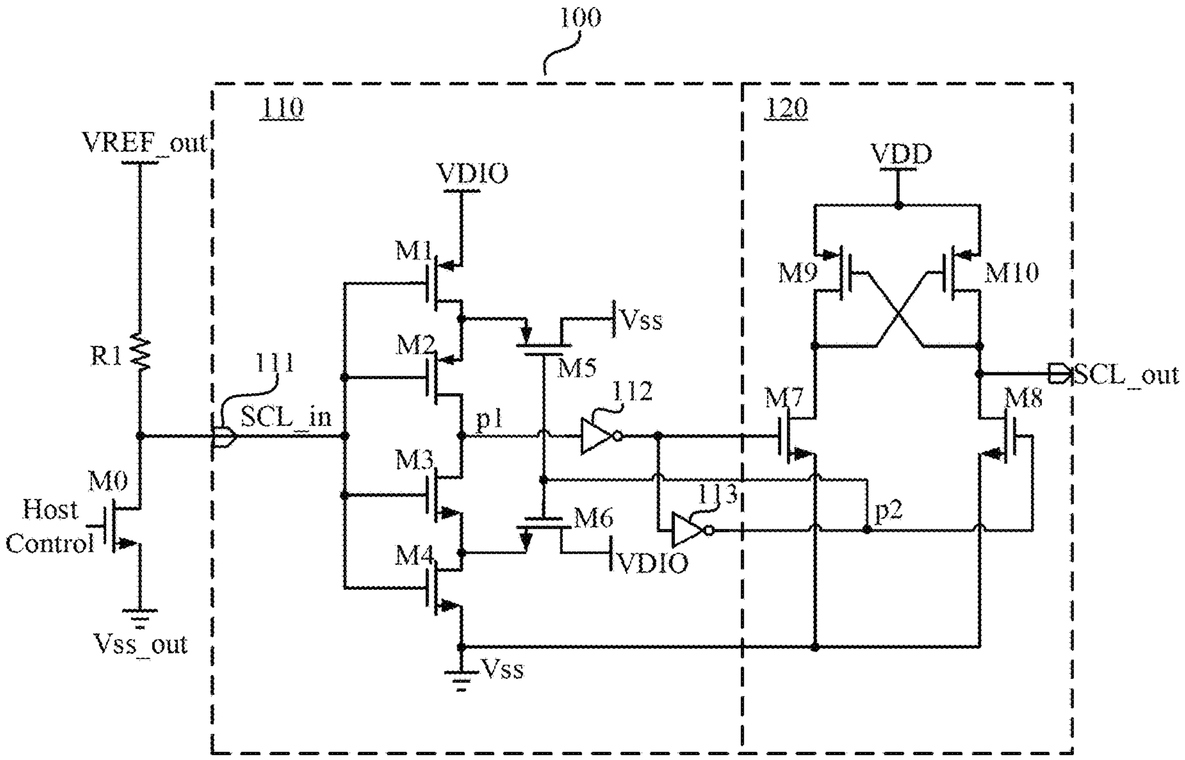
FIG. 1 PRIOR ART
FIG. 1 shows a schematic circuit diagram of a conventional I2C interface circuit 100 of a power management integrated circuit.
Figure 2:
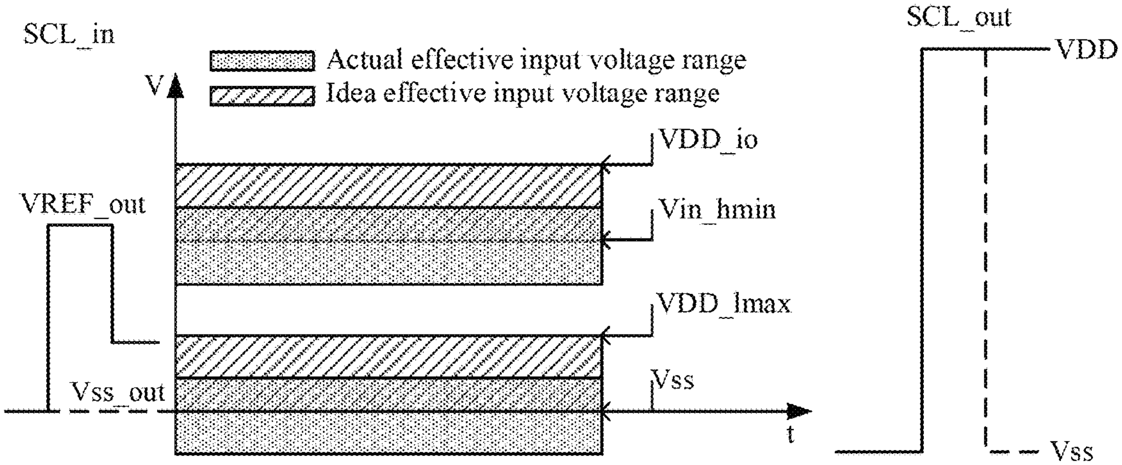
FIG. 2 PRIOR ART
FIG. 2 shows operating waveforms of a conventional I2C interface circuit.

The present disclosure will be described in more detail below with reference to accompanying drawings. In various figures, the same elements are denoted by similar reference numerals. For the sake of clarity, various parts in the accompanying drawings are not drawn to scale. Moreover, certain well-known parts may not be shown in the figures.

Many specific details of the present disclosure, such as the structure, material, dimensions, treatment processes, and techniques of the components, are described below for more clear understanding of the present disclosure. However, as will be appreciated by those skilled in the art, the present disclosure may not be practiced in accordance with these specific details.

It should be understood that in the following description, the word "circuit" may include single or multiple combinations of hardware circuits, programmable circuits, state machine circuits, and/or components capable of storing instructions which are executed by a programmable circuit. Conversely, when the element is said to be "directly coupled" or "directly connected" to another element, it means that there is no intermediate element therebetween.

Figure 3:
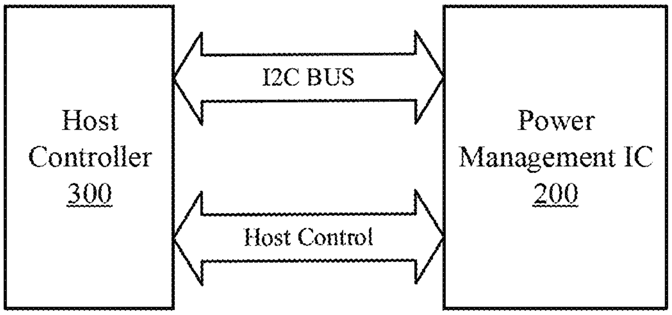
FIG. 3 shows a structural block diagram of a control system of a power management integrated circuit according to an embodiment of the present disclosure.

FIG. 3 shows a structural block diagram of a control system of a power management integrated circuit according to an embodiment of the present disclosure. As shown in FIG. 3, the control system includes a power management integrated circuit 200 and a host controller 300. The power management integrated circuit 200 is used to supply power to various functional units of a terminal. The host controller 300 is used to detect supply voltages and actual power consumption of various functional units, and transmit regulation parameters corresponding to the requirements to the power management integrated circuit 200. The power management integrated circuit 200 is also used to output the supply voltages to various functional units according to the regulation parameters.

In a preferred embodiment, each of the host controller 300 and the power management integrated circuit 200 includes a communication unit, ensuring that the host controller 300 can correctly transmit regulation parameters to the power management integrated circuit 200. Further, the communication unit in each of the host controller 300 and the power management integrated circuit 200 is an I2C communication unit, which ensures the stability of information transmission. In a preferred embodiment, the host controller 300 and the power management integrated circuit 200 are connected through an I2C bus (I2C BUS). Information exchange between the external host (Host) and registers inside the integrated circuit is realized using a serial data (SDA) line and a serial clock (SCL) line in the I2C bus. This allows a user to flexibly configure charging and discharging parameters and read status of the power supply.

Figure 4:
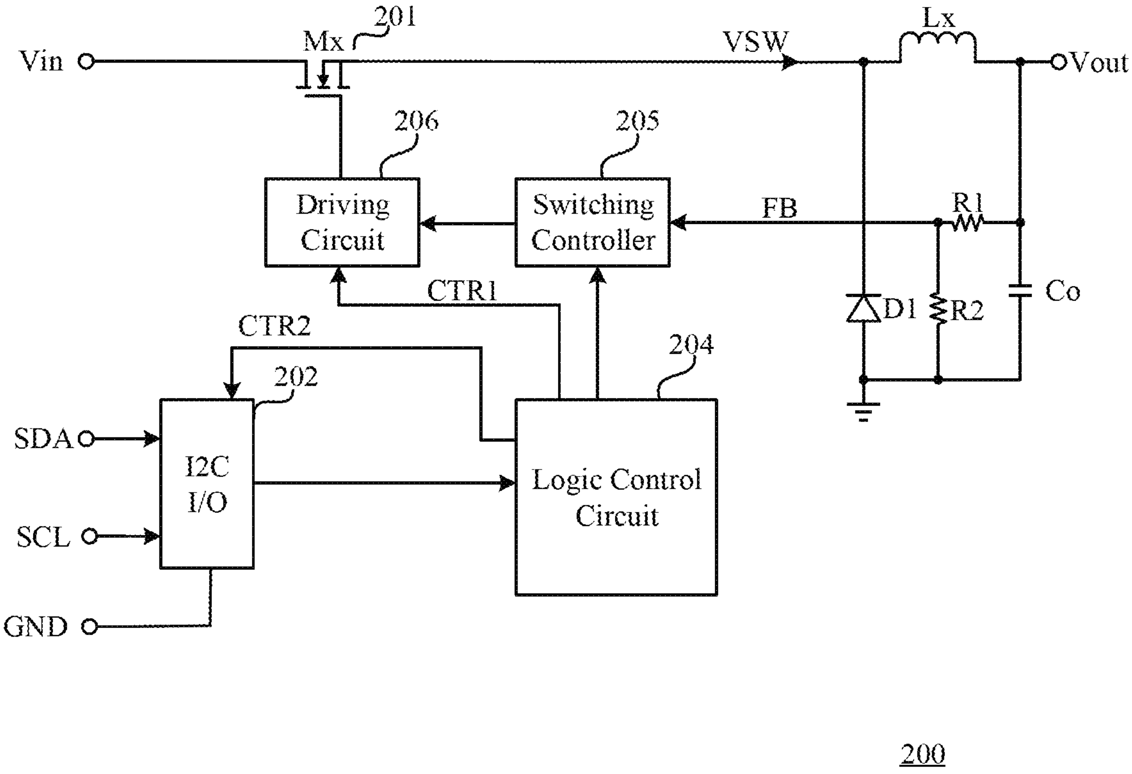
FIG. 4 shows a structural block diagram of a power management integrated circuit according to an embodiment of the present disclosure.

FIG. 4 shows a structural block diagram of a power management integrated circuit according to an embodiment of the present disclosure. The power management integrated circuit according to the present disclosure is also referred to as a programmable power management integrated circuit, or to an output voltage programmable power integrated circuit, referred to as an integrated circuit. The power management integrated circuit includes: a power circuit 201, an I2C interface circuit 202, a logic control circuit 204, a switching controller 205, and a driving circuit 206.

Here, the power circuit 201 includes one or more switching elements and filter elements (e.g., inductors and/or capacitors, etc.) configured to regulate power transmission from an input terminal to an output terminal of the switching converter in response to a switching driving signal, so as to convert an input voltage Vin to a stable and continuous output voltage Vout.

In some embodiments, according to the topology classification of the power circuit 201, it can be categorized as a buck converter, a boost converter, a flyback converter, and a buck-boost converter.

In this embodiment, the power circuit 201 is implemented by a buck topology, including a power switch Mx and a peripheral inductor element Lx and a rectification diode D1. Here, the power switch Mx has a first terminal coupled to an input voltage Vin, a second terminal coupled with an anode of the rectification diode D1. A cathode of the rectification diode D1 is grounded. A switching node SW is formed at a common end of the power switch Mx and the rectification diode D1. The inductor element Lx has a first end coupled with the switching node, and a second end coupled to the output voltage Vout. The power switch Mx can be any controllable semiconductor switching device, such as a metal-oxide-semiconductor field effect transistor (MOSFET), an insulated-gate bipolar transistor (IGBT), etc.

It should be noted that although the MOSFET is used for the switching element in this embodiment, any other type of suitable switching element may be used without departing from the principles of the present disclosure. Moreover, although the present embodiment is described as an asynchronous buck converter, the present disclosure is not limited to this. The present disclosure is also applicable to a synchronous buck converter. Those skilled in the art may also use a synchronous rectification switching element instead of the rectification diode D1 in the above embodiment.

The I2C interface circuit 202 is connected to the serial clock (SCL) pin and the serial data (SDA) pin of the integrated circuit, and is mainly responsible for communicating with an I2C controller of the host controller for receiving regulation parameters set by the host controller.

The logic control circuit 204 receives the regulation parameters from the I2C interface circuit 202 and converts them into parameter information available for the switching controller 205. The unit can be enabled by an external host. Here, the logic control circuit 204 can control the switching controller 205 by converting the input regulation parameters to signals with a level using a DAC, or to a pulse signal with an adjustable duty cycle. Certainly, the logic control circuit 204 according to the present disclosure is not limited to the manner described above.

The switching controller 205 serves as a primary control element of the power management integrated circuit, for connecting and disconnecting a power path via the power switch Mx, thereby enabling an output of a voltage with various values. Specifically, the switching controller 205 is coupled to a feedback signal FB of the integrated circuit, and receives a voltage division signal of the output voltage Vout according to the feedback signal, and adjust switching of the power switch Mx accordingly, so as to stabilize an output voltage Vout. In some embodiments, the voltage division signal of the output voltage Vout is obtained by a voltage division network consisting of external resistors R1 and R2. In addition, the switching controller in the present disclosure may be a pulse width modulation (PWM) controller, a pulse frequency modulation (PFM) controller, a pulse width modulation and pulse frequency modulation (PWM-PFM) controller, or the like.

The driving circuit 206 is used to generate a driving signal of the power switch Mx according to the switching signal output by the switching controller 205 and apply it to the gate of the power switch Mx to control on and off states of the power switch Mx.

In order to solve the problem of false triggering or missing triggering of the I2C interface circuit caused by switching noise of the power switch Mx in the prior art, the power management integrated circuit 200 according to the embodiment of the present disclosure further includes switching a driving speed of the driving circuit 206 according to a first regulation signal CTR1 or adjusting a supply voltage of the I2C interface circuit according to a second regulation signal CTR2 to improve the communication stability of the I2C interface circuit, while balancing the efficiency problem of the DC/DC converter.

In one embodiment, the first regulation signal and the second regulation signal may be obtained by trimming outside the integrated circuit. In another embodiment, the first regulation signal CTR1 and/or the second regulation signal CTR2 may also be generated by the logic control circuit 204 when there is interference in the communication of the I2C interface circuit. The first regulation signal CTR1 is used to adjust the driving speed of the driving circuit, and the second regulation signal CTR2 is used to adjust the supply voltage of the I2C interface circuit. Therefore, when the I2C communication is interfered, the driving speed of the converter may be decreased, and even the supply voltage of the I2C interface circuit may be increased, to achieve the purpose of improving the communication accuracy. When the supply voltage of the I2C interface circuit 201 cannot be adjusted, the logic control circuit 204 may also adjust the driving speed of the driving circuit 206 to adapt the communication accuracy of the I2C interface. Therefore, the power management integrated circuit 200 according to the embodiment of the present disclosure may optimize and balance the corresponding functions according to the practical applications.

Figure 5:
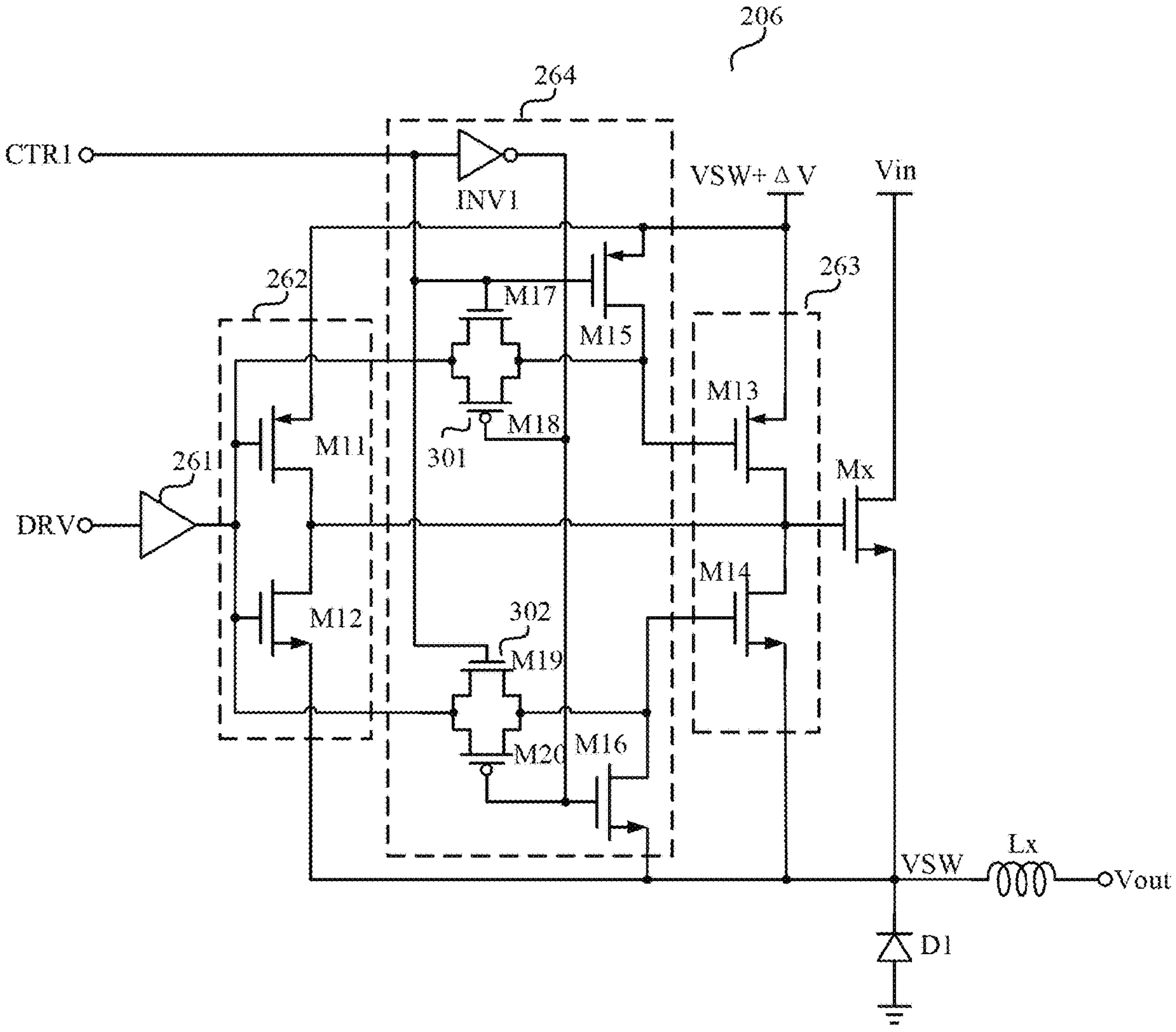
FIG. 5 shows a schematic circuit diagram of a driving circuit in a power management integrated circuit according to an embodiment of the present disclosure.

FIG. 5 shows a schematic circuit diagram of a driving circuit in a power management integrated circuit according to an embodiment of the present disclosure. The driving circuit 206 according to this embodiment includes a plurality of totem pole circuits to drive the power switch Mx. As shown in FIG. 5, the driving circuit 206 includes a buffer 261, a first totem pole circuit 262, and a second totem pole circuit 263 implemented by a plurality of cascaded totem pole circuits.

Here, an input terminal of the buffer 261 is coupled to a switching signal DRV from the controlle 205 in FIG. 4, with an output signal being applied to input terminals of the first totem pole circuit 262 and the second totem pole circuit 263. The first totem pole circuit 262 and the second totem pole circuit 263 are coupled in parallel between the voltage VSW+ΔV and a switching node VSW, with output terminals being coupled with a gate of the power switch Mx, so as to charge and discharge the gate of the power switch Mx for turning on or off the power switch Mx.

Specifically, the first totem pole circuit 262 includes transistors M11 and M12, the second totem pole circuit 263 includes transistors M13 and M14. The transistors M11 and M13 are for example P-channel transistors, the transistors M12 and M14 are for example N-channel transistors. The gates of the transistors M11 and M12 are coupled with the output terminal of the buffer 261. The source of transistor M11 is coupled to the voltage VSW+ΔV, the drain of transistor M11 is coupled with the drain of transistor M12 and the gate of the power switch Mx. The source of transistor M12 is coupled with the switching node VSW. The source of transistor M13 is coupled to the voltage VSW+ΔV, and the drain of transistor M13 is coupled to the drain of transistor M14 and the gate of the power switch Mx. The transistors M11 and M12 are turned on complementarily, the transistors M13 and M14 are turned on complementarily. Moreover, the transistors M11 and M13 in an on state are used to charge the gate of the power switch Mx to turn on the power switch Mx, and the transistors M12 and M14 in an on state are used to discharge the gate of the power switch Mx to turn off the power switch Mx. In an off state of the power switch Mx, the rectification diode D1 provides a freewheeling current of the inductor Lx. A ground voltage in the integrated circuit will be pulled down, which will cause noise that is not easily eliminated at ground of the I2C interface circuit in the integrated circuit.

To solve this problem, the driving circuit 206 according to this embodiment further includes a driving control unit 264. The driving control unit 264 is used to control a signal path between the second totem pole circuit 263 and the buffer 261 according to the first regulation signal CTR1 to enable or disable the second totem pole circuit 263, thereby achieving the purpose of adjusting the driving speed of the power switch Mx.

Here, the first regulation signal CTR1 may be set to be logic high or logic low. When the first regulation signal CTR1 is at a high level, the second totem pole circuit 263 is enabled. Thus, the power switch Mx is driven by both the first totem pole circuit 262 and the second totem pole circuit 263. In such case, the switching speed of the power switch Mx is large, resulting in increased noise in the I2C interface circuit. When the first regulation signal CTR1 is at a low level, the second totem pole circuit 263 is disabled. Thus, the power switch Mx is driven only by the first totem pole circuit 262. In such case, a time constant from the previous buffer to the power switch Mx is small, the switching speed of the power switch Mx is small, and the noise in the I2C interface circuit is also small.

Specifically, the driving control unit 264 according to this embodiment includes an inverter Inv1, a switch 301, a switch 302, and transistors M15 and M16.

Here, an input terminal of the inverter INV1 is used to receive the first regulation signal CTR1, and an output terminal of the inverter INV1 is used to output an inverted signal of the first regulation signal.

An input terminal of the switch 301 is coupled with the output of the buffer 261, and an output terminal of the switch 301 is coupled with a gate of transistor M13. The on and off sates of the switch 301 is controlled by the first regulation signal CTR1. The switch 301 in an on state establishes a signal path between the buffer 261 and the gate of transistor M13, and the switch 301 in an off state disconnects the signal path between the buffer 261 and the gate of transistor M13. The switch 301 is implemented, for example, by N-channel transistor M17 and the P-channel transistor M18 which are coupled in parallel. First terminals of transistors M17 and M18 are coupled with each other, as the input terminal of the switch 301 that is coupled with the output of the buffer 261. Second terminals of transistors M17 and M18 are coupled with each other, as the output terminal of the switch 301 that is coupled with the gate of transistor M13. A gate of transistor M17 is coupled to the first regulation signal CTR1. A gate of transistor M18 is coupled to an inverted signal of the first regulation signal CTR1.

Transistor M15 is a P-channel transistor, with a gate being coupled to the first regulation signal CTR1, a source being coupled to the voltage VSW+ΔV, and a drain being coupled to the gate of transistor M13.

An input terminal of the switch 302 is coupled with the output of the buffer 261, and an output terminal of the switch 302 is coupled with a gate of transistor M14. The on and off states of the switch 302 is controlled by the first regulation signal CTR1. The switch 302 in an on state establishes a signal path between the buffer 261 and the gate of transistor M14, and the switch 302 in an off sate disconnects the signal path between the buffer 261 and the gate of the transistor M14. The switch 302 is implemented, for example, by N-channel transistor M19 and P-channel transistor M20 which are coupled in parallel. First terminals of transistors M19 and M20 are coupled with each other, as the input terminal of the switch 302 that is coupled with the output of the buffer 261. Second terminals of transistors M19 and M20 are coupled with each other, as the output terminal of the switch 302 that is coupled with the gate of the transistor M14. A gate of transistor M19 is coupled to the first regulation signal CTR1. A gate of transistor M20 is coupled to an inverted signal of the first regulation signal CTR1.

Transistor M16 is an N-channel transistor, with a gate being coupled to the inverted signal of the first regulation signal CTR1, a source being coupled to the voltage VSW, and a drain being coupled to the gate of transistor M14.

When the first regulation signal CTR1 is at a low level, the switches 301 and 302 are turned off, the signal path between the buffer 261 and the gates of transistors M13 and M14 is disconnected. Meanwhile, transistors M15 and M16 are turned on, for pulling up the gate of transistor M13 to the voltage VSW+ΔV and pulling down the gate of transistor M14 to the voltage VSW, respectively, thereby turning off transistors M13 and M14. When the first regulation signal CTR1 is at a high level, the switches 301 and 302 are turned on, transistors M15 and M16 are turned off, and the transistors M13 and M14 are turned on complementarily, according to the output of the buffer 261, respectively, participating in a driving process of the power switch Mx.

It can be seen from the above description that the power management integrated circuit according to this embodiment can reduce the noise generated in the I2C interface circuit, by reducing a switching speed of the power switch. However, the reduction of the driving speed will cause the power switch to generate energy consumption during the on and off operations and then lose a conversion efficiency of the power supply.

Figure 6:
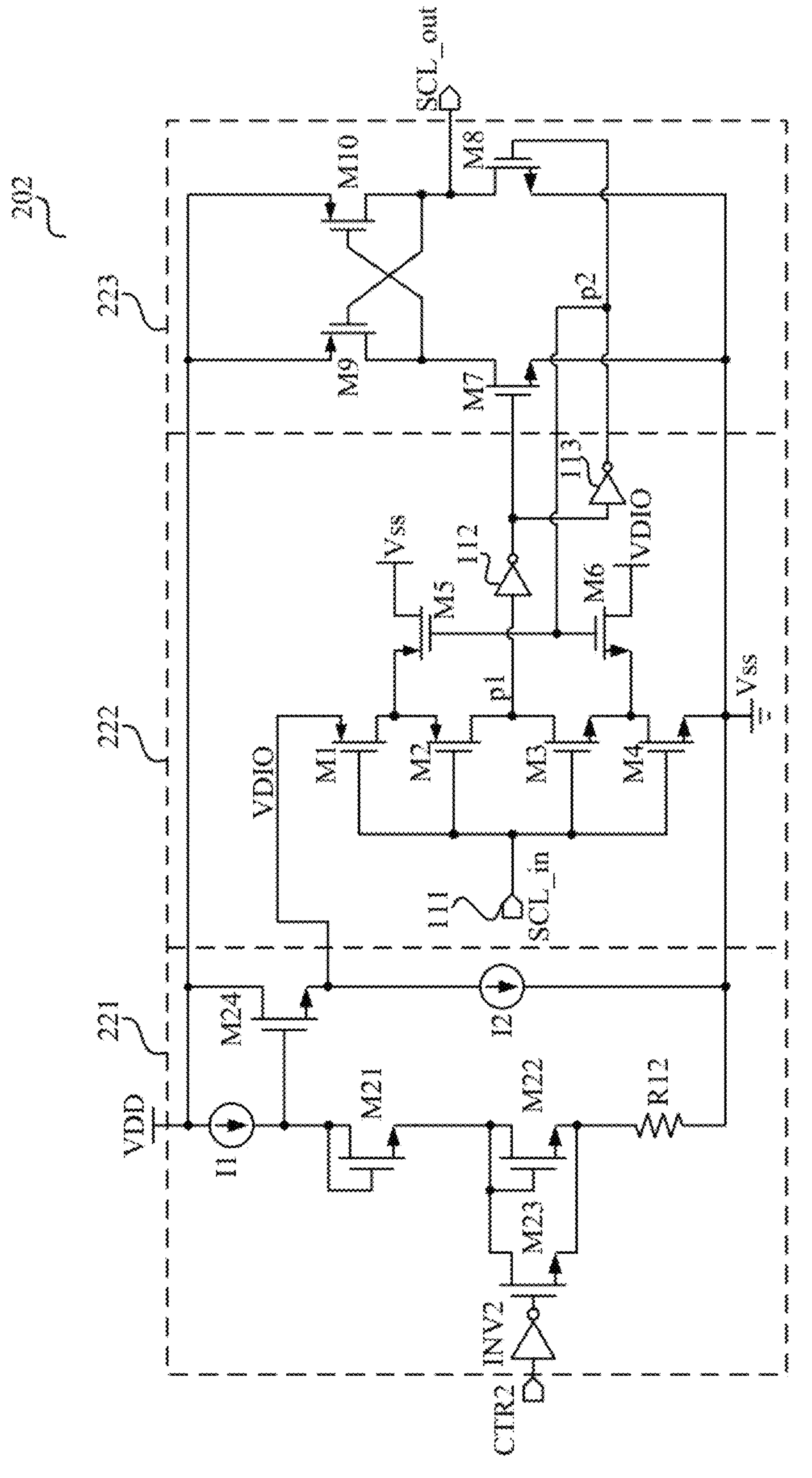
FIG. 6 shows a schematic circuit diagram of an I2C interface circuit in a power management integrated circuit according to an embodiment of the present disclosure.

FIG. 6 shows a schematic circuit diagram of an I2C interface circuit in a power management integrated circuit according to an embodiment of the present disclosure. As shown in FIG. 6, the I2C interface circuit 202 according to this embodiment includes a supply voltage generation unit 221, a trigger unit 222, and an output buffer 223. The supply voltage generation unit 221 is used to generate a supply voltage VDIO of the trigger unit 222 according to a power supply voltage VDD. The output buffer 223 is directly powered by the power supply voltage VDD.

The supply voltage generation unit 221 includes current sources I1 and I2, an inverter INV2, a resistor R12, and transistors M21 to M24. Transistors M21 to M24 are N-channel transistors. A first end of the current source I1 is coupled to the power supply voltage VDD, while a second end of the current source I1 is coupled with a gate and a drain of transistor M21. A source of transistor M21 is coupled with a drain and a gate of transistor M22. A source of transistor M22 is coupled to a first end of resistor R12, and a second end of resistor R12 is coupled to a ground voltage Vss. An input terminal of the inverter INV2 is coupled to a second regulation signal CTR2, an output terminal of the inverter INV2 is coupled with a gate of transistor M23. A drain of transistor M23 is connected to a drain of transistor M22, and a source of transistor M23 is coupled to a source of transistor M22. A drain of transistor M24 is coupled to the power supply voltage VDD, a gate of transistor M24 is coupled to a common node between the current source I1 and transistor M21, a source of transistor M24 is used to output the supply voltage VDIO. The current source I2 is coupled between the source of transistor M24 and the ground voltage Vss.

When the second regulation signal CTR2 is at a low level, transistor M23 is turned on to short transistor M22. According to the equation VDIO=I1×R12+Vth_M21−Vth_M24, where Vth_M21 and Vth_M24 represent on thresholds of transistors M21 and M24, respectively. A first value of the supply voltage VDIO can be calculated to be, for example, 1.2V. When the second regulation signal CTR2 is at a high level, transistor M23 is turned off. According to the equation VDIO=I1×R12+Vth_M21+Vth_M22−Vth_M24, where Vth_M22 is an on threshold of transistor M22. A second value of the supply voltage VDIO can be calculated to be, for example 1.8V. According to the I2C communication protocol, an increased supply voltage can extend a transformation range of a logic input signal of the trigger unit 222. Even if a voltage difference between the internal and external grounds of the integrated circuit is relatively large, it can ensure that the trigger unit 222 can more easily recognize reverse of the SDA and SCL signals.

Further, the trigger unit 222 is implemented, for example, by a Schmitt trigger, including an input terminal 111 for receiving a logic input signal SCL_in and coupling the logic input signal SCL_in to gates of transistors M1-M4, which in turn are coupled between the supply voltage VDIO, which is an I/O voltage internally designed for the interface circuit, and the ground voltage Vss, which is a ground having noise inside the integrated circuit. An input terminal of the inverter 112 and drains of transistors M2 and M3 are coupled with a node p1, and an output terminal of the inverter 112 is coupled with a gate of transistor M7 in the output buffer 223. An input terminal of the inverter 113 is coupled with the output terminal of the inverter 112, and an output terminal of the inverter 113 is coupled with a gate of transistor M8 in the output buffer 223. The output buffer 223 is used to shape output signals of the inverters 112 and 113 to obtain a logic output signal SCL_out. A source of transistor M5 is coupled with a drain of transistor M1 and a source of transistor M2, and a drain of transistor M5 is coupled to the ground voltage Vss. A source of transistor M6 is coupled with a source of transistor M3 and a drain of transistor M4, and a drain of transistor M6 is coupled to the supply voltage VDIO. Gates of transistors M5 and M6 are coupled with the output terminal of the inverter 113 at a node p2.

The output buffer 223 further includes transistors M9 and M10. Sources of transistors M9 and M10 are coupled to the power supply voltage VDD. A gate of transistor M9 is coupled with a drain of transistor M10. A gate of transistor M10 is coupled with a drain of transistor M9. The drains of transistors M9 and M10 are also coupled with drains of transistors M7 and M8, respectively. Sources of transistors M7 and M8 are coupled to the ground voltage Vss. The drain of transistor M8 is also coupled with the output terminal of the logic output signal SCL_out.

Here, transistors M1, M2, M5, M9, and M10 are P-channel transistors, and transistors M3, M4, M6, M7, and M8 are N-channel transistors. When the logic input signal SCL_in is at a low level, transistors M1, M2, and M6 are turned on, and transistors M3 to M5 are turned off. Voltages at nodes p1 and p2 are approximately equal to the supply voltage VDIO. Then, transistor M8 is turned on to pull down the logic output signal SCL_out to the ground voltage Vss. When the logic input signal SCL_in reverses from a low level to a high level, if the voltage of the logic input signal SCL_in is larger than an on threshold of transistor M4, transistor M4 is first turned on, and then the transistors M3 is turned on, and subsequently, transistors M1 and M2 are turned off, to pull down the nodes p1 and p2 to Vss. Transistor M8 is then turned off to pull up the logic output signal SCL_out to the power supply VDD. Consequently, the logic output signal SCL_out reverses from a low level to a high level. Similarly, the circuit can also reverse the output signal SCL_out from a high level to a low level. Thus, the circuit performs a level shift between a logic signal (i.e. Host Control) of an external power rail and a logic signal of an internal power rail.

To sum up, the power management integrated circuit according to the present disclosure includes an I2C interface circuit, and can provide a first regulation signal and/or a second regulation signal when communication of the I2C interface circuit is interfered. This allows for adjustment of a driving speed of the driving circuit and/or a supply voltage of the I2C interface circuit. Consequently, when the I2C communication of the integrated circuit is interfered, the driving speed of the converter may be decreased, and even the supply voltage of the I2C interface circuit may be increased, to achieve the purpose of improving communication accuracy. Moreover, the power management integrated circuit according to the present disclosure can also optimize and balance corresponding functions according to actual applications, so as to balance an efficiency of the converter while improving the communication accuracy.

It should be noted that although the device is described herein as some kind of N-channel or P-channel device, or some kind of N-type or P-type doped region, it will be appreciated by those of ordinary skill in the art that complementary devices can also be implemented in accordance with the present disclosure. It will be appreciated by those of ordinary skill in the art that the type of conductivity refers to the mechanism that conduction occurs, such as hole conductivity or electron conductivity. Therefore, the type of conductivity does not relate to a doping concentration, but to the type of doping, such as P-type or N-type. It will be appreciated by those of ordinary skill in the art that the words “during”, “when”, and “while” used herein in connection with circuit operation are not strict terms for actions that occur immediately at the beginning of a start action, but that there may be some small but reasonable one or more delays after a reaction action initiated by a start action, such as various transmission delays, etc. As used herein, the word “approximately” or “substantially” means an element has a parameter that is expected to approximate the declared value or location. However, as is well known in the art, there are always minor deviations that make it difficult to have the value or position to be strictly the declared value. It has been properly determined in the art that a deviation of at least ten percent (10%) is a reasonable deviation from the precise desired target described (for a doping concentration of semiconductor, at least twenty percent (20%)). When a signal is described in the context of a state, an actual voltage value or logic state of the signal (e.g. “1” or “0”) depends on whether positive or negative logic is used.

It should also be noted that in this description, relational terms such as first and second are merely used to distinguish one entity or operation from another, and do not necessarily require or imply that there is any such actual relationship or sequence among these entities or operations. Furthermore, the word “include”, “contain”, or any other variation thereof is intended to cover non-exclusive inclusion, so that a process, method, article, or device including a series of elements includes not only those elements, but other elements that are not explicitly listed or elements inherent to such process, method, article, or device. In the absence of further limitations, elements defined by the phrase “comprises a . . . ” do not exclude the presence of additional identical elements in the process, method, article, or device that includes the elements.

In accordance with the embodiments of the present disclosure, such as described above, these embodiments do not describe all the details in detail, nor do they limit the invention to the specific embodiments described. Obviously, a lot of modifications and changes can be made based on the above description. These embodiments are selected and specifically described in this specification in order to better explain the principles and practical applications of the present disclosure, so that those skilled in the art can make good use of the present disclosure and its modifications on the basis of the present disclosure. The present disclosure is limited only by the claims and their full scope and equivalents.

What is claimed is:

1. A power management integrated circuit, comprising:

an I2C interface circuit that is coupled with a logic pin of the integrated circuit and communicates with an external host controller to receive regulation parameters set by the host controller; and a driving circuit that converts a switching signal into a driving signal and applies the driving signal to a control terminal of a power switch in the power management integrated circuit, and that regulates power transmission from the input terminal to an output terminal of the power management integrated circuit by controlling on and off states of the power switch to provide a stable output voltage, the switching signal being obtained according to the regulation parameters, wherein the driving circuit comprises:

a buffer having an input terminal for receiving the switching signal;

a first totem pole circuit and a second totem pole circuit that are coupled with each other in parallel for charging and discharging a control terminal of the power switch according to an output of the buffer; and a driving control unit that receives a first regulation signal, controls a signal path between the second totem pole circuit and the buffer according to the first regulation signal, and adjusts a driving speed of the driving circuit by enabling or disabling the second totem pole circuit.

2. The power management integrated circuit according to claim 1, wherein the I2C interface circuit comprises:

a supply voltage generation unit that supplies a supply voltage to a trigger unit, receives a second regulation signal, and adjusts a value of the supply voltage according to the second regulation signal;

a trigger unit that receives a logic input signal from a logic pin of the integrated circuit, and compares the logic input signal with a threshold voltage to generate a first signal; and an output buffer for shaping the first signal to obtain a logic output signal.

3. The power management integrated circuit according to claim 1, wherein the second totem pole circuit comprises:

a first transistor and a second transistor coupled between a first voltage and a second voltage, control terminals of the first transistor and the second transistor being coupled with an output of the driving control unit, and an intermediate node of the first transistor and the second transistor being coupled with a control terminal of the power switch.

4. The power management integrated circuit according to claim 3, wherein the driving control unit comprises:

a first switch coupled between the output of the buffer and the control terminal of the first transistor; and a second switch coupled between the output of the buffer and the control terminal of the second transistor, wherein the first regulation signal controls a signal path between the buffer and the second totem pole circuit by controlling on and off states of the first switch and the second switch.

5. The power management integrated circuit according to claim 4, wherein the driving control unit further comprises:

a third transistor having a first terminal coupled to the first voltage, a second terminal coupled with the control terminal of the first transistor, and a control terminal coupled to the first regulation signal; and a fourth transistor having a first terminal coupled with the control terminal of the second transistor, a second terminal coupled to the second voltage, and a control terminal coupled to an inverted signal of the first regulation signal.

6. The power management integrated circuit according to claim 5, wherein when the first regulation signal is at a high level, the first switch and the second switch are turned on, the third transistor and the fourth transistor are turned off, and the first transistor and the second transistor are turned on alternatively in non-overlapping manner according to the output of the buffer, when the first regulation signal is at a low level, the first switch and the second switch are turned off, the third transistor and the fourth transistor are turned on, and the first transistor and the second transistor are turned off.

7. The power management integrated circuit according to claim 5, wherein the first transistor and the third transistor are P-channel transistors, and the second transistor and the fourth transistor are N-channel transistors.

8. The power management integrated circuit according to claim 2, wherein the supply voltage generation unit comprises:

a first current source, a fifth transistor, a sixth transistor, and a first resistor which are sequentially coupled between a supply voltage and a ground voltage, each of the fifth transistor and the sixth transistor being connected as a MOS diode;

a seventh transistor and a second current source which are sequentially coupled between the supply voltage and the ground voltage, a control terminal of the seventh transistor being coupled with a second end of the first current source, a second terminal of the seventh transistor being used to provide the supply voltage, an inverter having an input terminal for receiving the second regulation signal; and an eighth transistor coupled in parallel with the sixth transistor, and a control terminal of the eighth transistor being coupled with an output terminal of the inverter.

9. The power management integrated circuit according to claim 2, wherein the trigger unit is a Schmitt trigger.

10. The power management integrated circuit according to claim 8, wherein the ground voltage is a ground having noise in the integrated circuit.

11. The power management integrated circuit according to claim 1, further comprising:

a power circuit, comprising at least one power switch and an inductor element, and being used to regulate power transmission from an input terminal to an output terminal of the power management integrated circuit to provide a stable output voltage;

a logic control circuit for receiving the regulation parameters from the I2C interface circuit and converting the regulation parameters into parameter information available for a switching controller; and a switching controller for generating a switching signal according to the parameter information.

12. The power management integrated circuit according to claim 11, wherein regulation signals of a driving speed of the driving circuit and/or a supply voltage of the I2C interface circuit are derived from a trimming signal outside the integrated circuit, or are provided by the logic control circuit.

* * * * *